(12) United States Patent
Phillips et al.

(10) Patent No.: US 12,110,609 B2
(45) Date of Patent: Oct. 8, 2024

(54) METHODS FOR FORMING A SINGLE CRYSTAL SILICON INGOT WITH REDUCED CRUCIBLE EROSION

(71) Applicant: GlobalWafers Co., Ltd., Hsinchu (TW)

(72) Inventors: Richard Joseph Phillips, St. Peters, MO (US); Salvador Zepeda, St. Peters, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/152,993

(22) Filed: Jan. 20, 2021

(65) Prior Publication Data

US 2022/0145491 A1 May 12, 2022

Related U.S. Application Data

(60) Provisional application No. 63/112,431, filed on Nov. 11, 2020.

(51) Int. Cl.
*C30B 15/10* (2006.01)
*C30B 15/30* (2006.01)
*C30B 29/06* (2006.01)

(52) U.S. Cl.
CPC ............ *C30B 15/10* (2013.01); *C30B 15/30* (2013.01); *C30B 29/06* (2013.01)

(58) Field of Classification Search
CPC ......... C30B 15/04; C30B 15/02; C30B 15/10; C30B 15/002; Y10T 117/1056
See application file for complete search history.

(56) References Cited

U.S. PATENT DOCUMENTS

| | | | | |
|---|---|---|---|---|
| 4,497,777 | A | | 2/1985 | Kojima |
| 5,080,873 | A | * | 1/1992 | Ono ............... B01J 4/001 117/214 |
| 5,314,667 | A | * | 5/1994 | Lim ............... C30B 15/12 117/214 |
| 5,367,979 | A | * | 11/1994 | Watanabe ....... C30B 15/00 117/14 |
| 5,462,010 | A | | 10/1995 | Takano et al. |
| 6,422,861 | B1 | * | 7/2002 | Antczak ......... C03B 5/43 432/13 |
| 2010/0107965 | A1 | | 5/2010 | Fukui et al. |
| 2010/0294999 | A1 | | 11/2010 | Narushima et al. |

(Continued)

FOREIGN PATENT DOCUMENTS

| | | | |
|---|---|---|---|
| JP | S5669298 A | 10/1981 | |
| JP | 04016588 A * | 1/1992 | ............ C30B 15/02 |

(Continued)

OTHER PUBLICATIONS

English computer translation of JP 04-016588 A (Year: 2023).*
ISR and Written Opinion for International Application No. PCT/US2020/067382, 12 pages, Jul. 26, 2021.

*Primary Examiner* — Matthew J Song
(74) *Attorney, Agent, or Firm* — Armstrong Teasdale LLP

(57) ABSTRACT

Methods for forming a single crystal silicon ingot with reduced crucible erosion are disclosed. Solid-phase quartz is added to the melt to reduce erosion at the crucible-melt surface interface. The quartz may be synthetic quartz such as synthetic quartz rods. The quartz may be disposed near the crucible-melt surface interface. Quartz dissolves and suppresses the amount of quartz that dissolves from the crucible at the crucible-melt surface interface.

17 Claims, 4 Drawing Sheets

(56) References Cited

U.S. PATENT DOCUMENTS

| | | | |
|---|---|---|---|
| 2011/0286906 A1* | 11/2011 | Arvidson | C30B 11/001 117/54 |
| 2012/0279437 A1* | 11/2012 | Johnson | C30B 15/12 117/19 |
| 2015/0144056 A1* | 5/2015 | Swaminathan | C30B 15/12 117/213 |
| 2015/0233014 A1 | 8/2015 | Luter et al. | |
| 2018/0112327 A1 | 4/2018 | Hünermann et al. | |
| 2018/0187329 A1* | 7/2018 | Zepeda | C30B 15/12 |
| 2019/0203377 A1* | 7/2019 | Mehdizadeh Dehkordi | C03C 1/008 |

FOREIGN PATENT DOCUMENTS

| | | |
|---|---|---|
| JP | H11116374 A | 4/1999 |
| JP | 2011121843 A | 6/2011 |
| WO | 2016152057 A1 | 9/2016 |

* cited by examiner

METHODS FOR FORMING A SINGLE CRYSTAL SILICON INGOT WITH REDUCED CRUCIBLE EROSION

CROSS-REFERENCE TO RELATED APPLICATION

This application claims the benefit of U.S. Provisional Patent Application No. 63/112,431, filed Nov. 11, 2020, which is incorporated herein by reference in its entirety.

FIELD OF THE DISCLOSURE

The field of the disclosure relates to methods for forming a single crystal silicon ingot with reduced crucible erosion and, in particular, methods that involve addition of quartz to the melt to reduce erosion at the interface of the crucible and melt surface.

BACKGROUND

Single crystal silicon ingots may be prepared by the so-called Czochralski method in which a single crystal seed is contacted with a silicon melt held within a crucible. The single crystal seed is withdrawn from the melt to pull the single crystal silicon ingot from the melt. High or ultra-high resistivity applications may use a crucible which includes a synthetic quartz liner to reduce introduction of impurities into the melt. High or ultra-high resistivity applications are characterized by extended cycle times to allow for dopant compensation. This can cause erosion through the synthetic liner which exposes the quartz base causing impurities to enter the melt thereby lowering the resistivity of the ingot.

A need exists for methods for preparing a single crystal silicon ingot in which the erosion rate of the crucible (e.g., synthetic lined or natural quartz crucible) is reduced.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for forming a single crystal silicon ingot. Solid-phase polycrystalline silicon is added to a crucible having a sidewall and a bottom. The polycrystalline silicon is heated to form a silicon melt having a surface. The silicon melt is contacted with a seed crystal. The seed crystal is withdrawn from the silicon melt to form a silicon ingot. Synthetic quartz is added to the melt. The synthetic quartz at least partially dissolves. The synthetic quartz abuts the crucible sidewall at the surface of the melt when it is dissolved.

Yet another aspect of the present disclosure is directed to a method for forming a single crystal silicon ingot. Solid-phase polycrystalline silicon is added to a crucible having a sidewall and a bottom. The polycrystalline silicon is heated to form a silicon melt. The silicon melt is contacted with a seed crystal. The seed crystal is withdrawn from the silicon melt to form a silicon ingot. Solid-phase quartz is added to the melt. The quartz is at least partially dissolved to reduce dissolution of the crucible. The quartz abuts the entire circumference of the crucible at the surface of the melt when it is dissolved.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
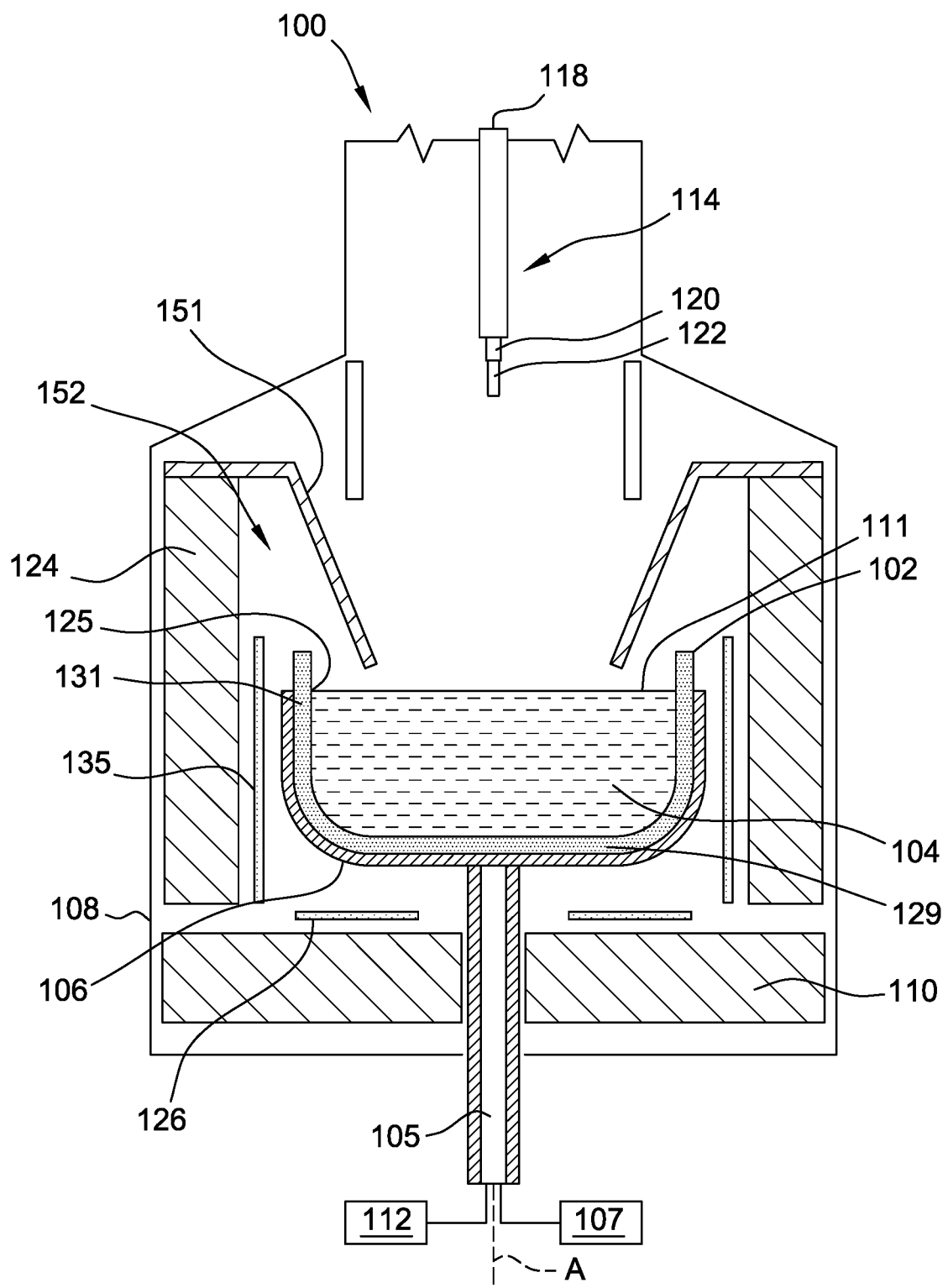
FIG. 1 is a cross-section of an ingot puller apparatus before silicon ingot growth.

Provisions of the present disclosure relate to methods for forming a single crystal silicon ingot in an ingot puller apparatus. As discussed further below, solid-phase quartz such as synthetic quartz (e.g., quartz rods) may be added to the melt to reduce erosion at the interface between the crucible and the melt surface.

The methods of the present disclosure may generally be carried out in any ingot puller apparatus that is configured to pull a single crystal silicon ingot. An example ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, supported by a susceptor 106. The ingot puller apparatus 100 includes a crystal puller housing 108 that defines a growth chamber 152 for pulling a silicon ingot 113 (FIG. 2) from the melt 104 along a pull axis A.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface).

In some embodiments, the crucible 102 is layered. For example, the crucible 102 may be made of a quartz base layer and a synthetic quartz liner disposed on the quartz base layer.

The susceptor 106 is supported by a shaft 105. The susceptor 106, crucible 102, shaft 105 and ingot 113 (FIG. 2) have a common longitudinal axis A or "pull axis" A.

A pulling mechanism 114 is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be pulled from the melt 104.

Figure 2:
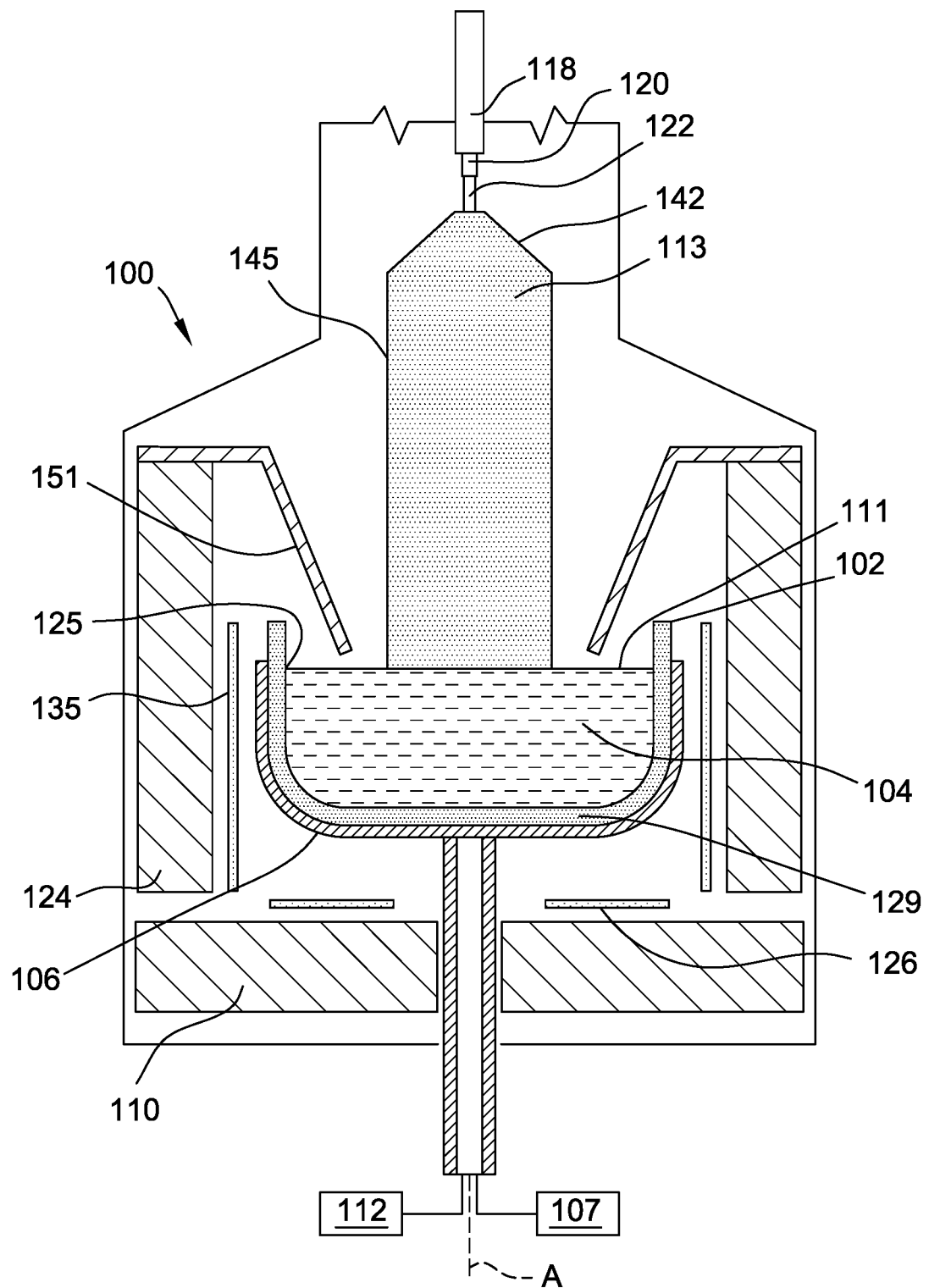
FIG. 2 is a cross-section of an ingot puller apparatus of FIG. 1 during silicon ingot growth.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, as shown in FIG. 1, the crucible 102 may be at a lowest position (near the bottom heater 126) in which a charge of solid-phase polycrystalline silicon previously added to the crucible 102 is melted. Crystal growth commences by contacting the melt 104 with the seed crystal 122 and lifting the seed crystal 122 by the pulling mechanism 114. As the ingot grows, the silicon melt 104 is consumed and the height of the melt in the crucible 102 decreases. The crucible 102 and susceptor 106 may be raised to maintain the melt surface 111 at or near the same positon relative to the ingot puller apparatus 100 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102. The semiconductor or solar-grade material that is introduced into the crucible is melted by heat provided from one or more heating elements. The ingot puller apparatus 100 includes bottom insulation 110 and side insulation 124 to retain heat in the puller apparatus. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline silicon charged to the crucible 102.

To form the ingot, the seed crystal 122 is contacted with the surface 111 of the melt 104. The pulling mechanism 114 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible 102 during crystal growth (FIG. 2).

Figure 3:
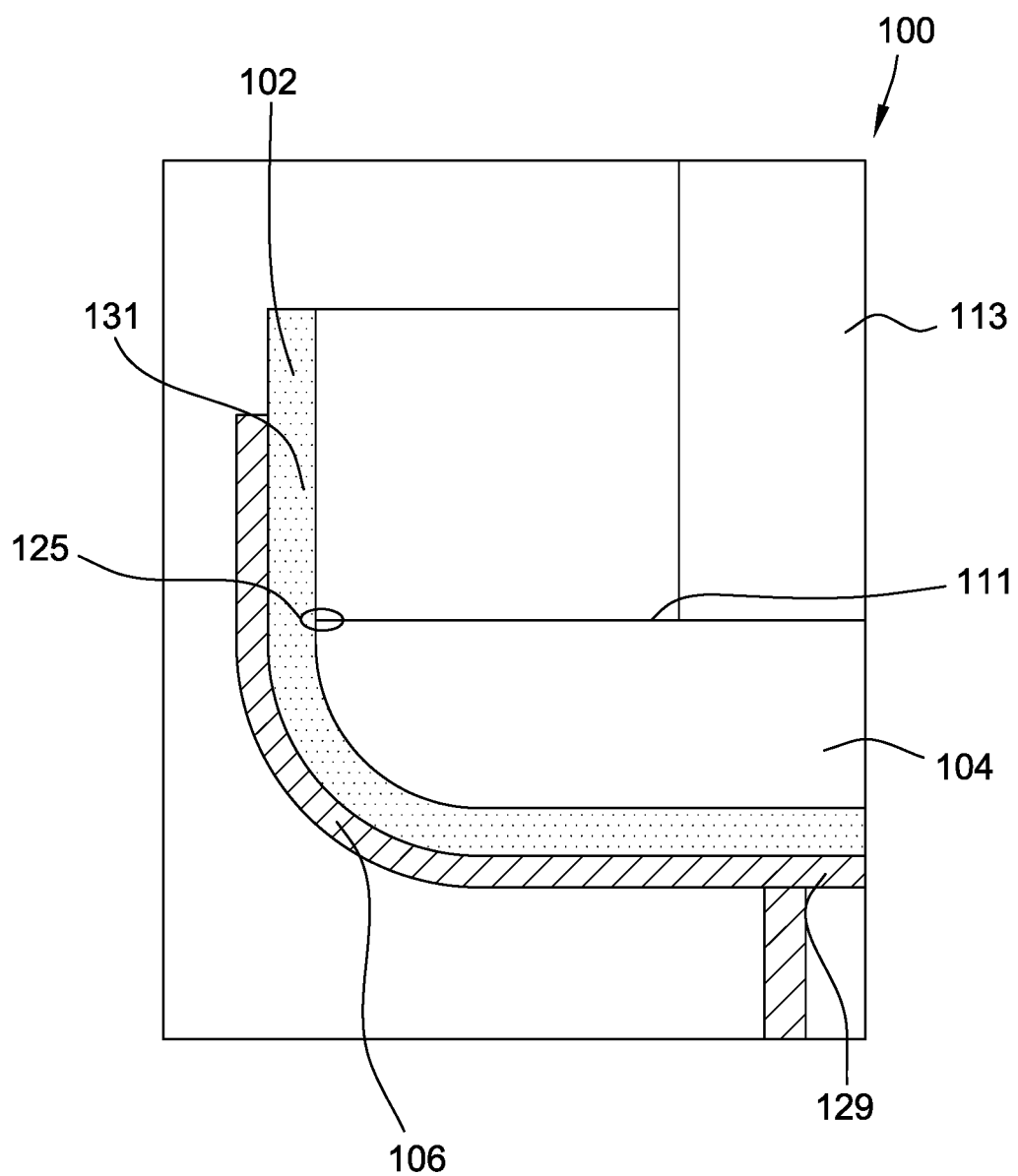
FIG. 3 is a detailed cross-section of an ingot puller apparatus showing the crucible-melt surface interface.

Referring now to FIG. 3 in which another embodiment of an ingot puller apparatus 100 is shown, the crucible 102 and melt surface 111 form an interface 125 (which is also referred to herein as the "crucible-melt surface interface" which is also known in the art as the "three-phase interface" or "tri-junction point" or more simply "tri-point"). This interface 125 moves along the crucible sidewall 131 and/or floor 129 (i.e., along the curved portion of the floor 129 when the melt is relatively depleted) as the level of the melt 104 changes. Without being bound by any particularly theory, the crucible (i.e., liner) erodes more at the crucible-melt surface interface 125 relative to other portions of the crucible because oxygen that evaporates from the melt surface as SiO is more readily replenished in the melt from the portions of the crucible with the least diffusion distance (i.e., both dissolution into the melt from the crucible and evaporation of oxygen from the melt surface occur at crucible-melt surface interface).

Figure 4:
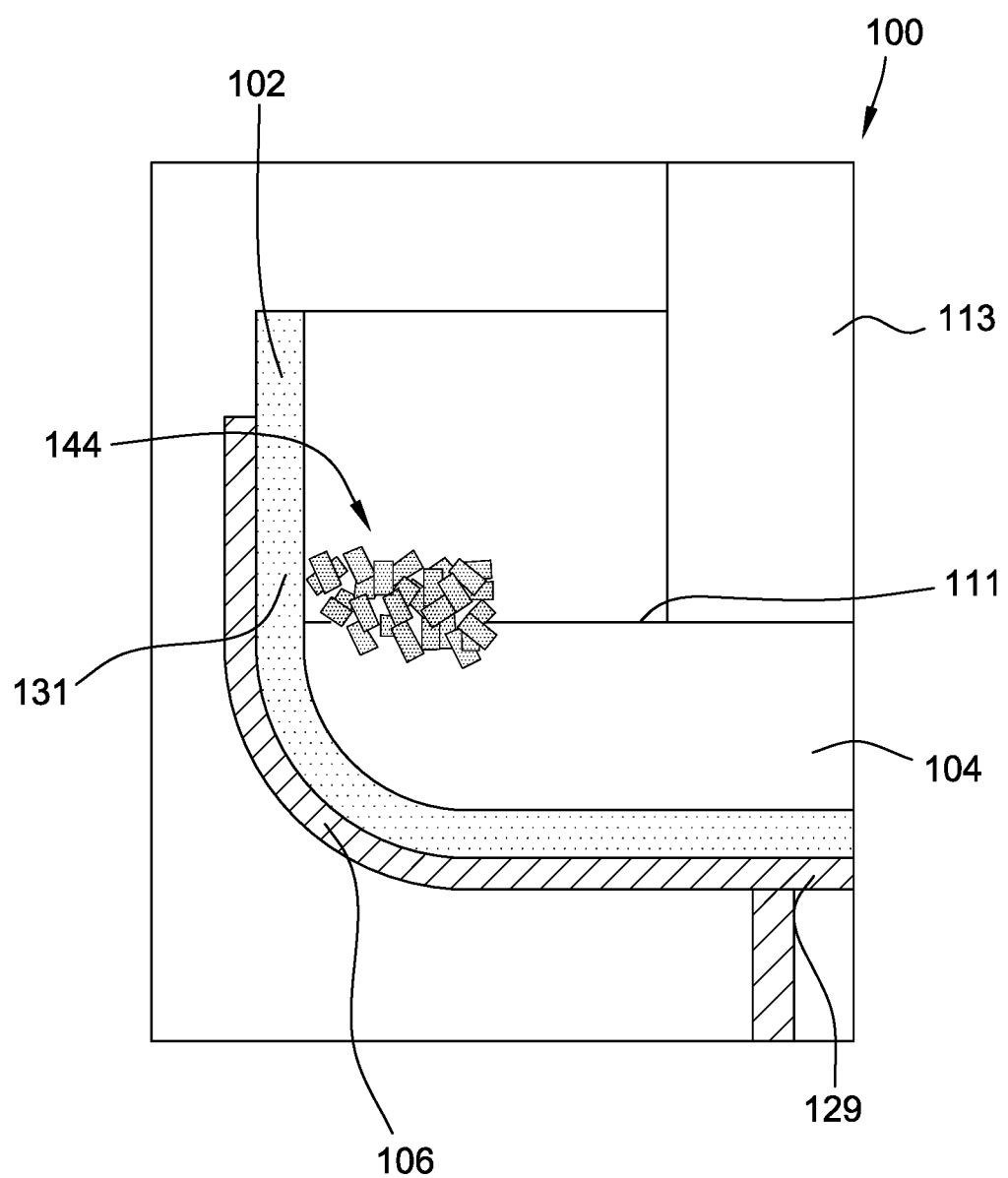
FIG. 4 is a detailed cross-section of an ingot puller apparatus of FIG. 3 with synthetic quartz rods at the crucible-melt surface interface.

According to embodiments of the present disclosure, quartz ($SiO_2$) 144 (FIG. 4) is added to the melt 104 before or during ingot 113 growth. Quartz 144 is positioned in the crucible 102 such that is abuts the crucible sidewall 131 at the surface 111 of the melt (e.g., by migration to the sidewall or being held in place by a securement device as discussed further below). Quartz 144 dissolves at the surface 111 of the melt 104 at the crucible sidewall 131 which suppresses erosion of the crucible at the crucible-melt surface interface 125. The oxygen that enters the melt from the quartz 144 evaporates as SiO which suppresses oxygen dissolved from the crucible 102 at the crucible-melt surface interface 125.

In some embodiments, solid-phase quartz 144 added to the melt 104 is synthetic quartz, i.e., quartz that is formed synthetically such as by a hydrothermal process rather than quartz that is processed from sand. Synthetic quartz that may be used includes SUPRASIL from Haraeus (Hanau, Germany) or Type 098 WGY quartz from Momentive Performance Materials (Waterford, N.Y.). Synthetic quartz is generally more chemically pure than quartz components formed from sand. In some embodiments, the synthetic quartz contains less than 5.0 ppmw or less impurities, 1.0 ppmw or less or even 0.7 ppmw or less impurities (e.g., 0.5 ppmw or less of aluminum and 0.2 ppmw or less of the sum of lithium, sodium, potassium and calcium).

In some embodiments, the quartz (e.g., synthetic quartz) 144 that is added to the crucible is shaped as a rod, hollow tube, sphere or an irregular shape (e.g., crushed quartz). Quartz rods may be formed by melting synthetic sand and extruding the melt as a rod. The rod may be cut into smaller segments (which may be referred to as "cullets") that are added to the melt 104. The rods may be acid washed prior to addition to the melt 104 to reduce impurities added to the melt 104. Solid-phase quartz added to the melt 104 may generally have any size (e.g., diameter and length when rods are used) effective to reduce erosion of the crucible (e.g., 1 to 20 mm or 2 to 10 mm in diameter and 1 to 20 mm or 2 to 10 mm in length when rods are used).

Quartz 144 may be added to the melt 104 such that the quartz is disposed about the entire circumference of the crucible 102 at the crucible-melt surface interface 125. In other embodiments, quartz 144 is added about a portion of the circumference of the crucible 102. Quartz 144 may generally be added in any amount sufficient to suppress erosion of the crucible at the crucible-melt surface interface 125. In some embodiments, the amount of quartz 144 added to the melt during an ingot pull cycle is at least 1 g per meter of crucible circumference or at least 10 g, at least 20 g, or at least 50 g of quartz per meter of crucible circumference (e.g., from about 1 g to about 500 g, from about 1 g to about 500 g, or about 10 g to about 500 g of quartz per meter of crucible circumference).

Quartz may generally be added to the melt 104 at any point of ingot growth including, without limitation, before growth of the silicon ingot (e.g., after meltdown and before the seed crystal 122 is lowered to contact the melt). Alternatively or in addition, quartz may be added during ingot growth. Quartz may be added no more than once to the melt or may be added in two or more cycles.

In some embodiments, the silicon ingot 113 may be characterized by high-resistivity or ultra-high resistivity (e.g., at least about 3000 ohm-cm, 5000 ohm-cm or at least 7000 ohm-cm or more). Such ingots 113 may involve longer cycle times and may be more susceptible to crucible erosion at the crucible-melt surface interface 125 making addition of quartz 144 particularly advantageous.

Quartz 144 may be maintained at the crucible-melt surface interface 125 in any suitable manner. For example, rotation of the crucible 102 may cause a centrifugal force to be applied to the quartz segments (e.g., rods) causing the synthetic quartz to abut the crucible sidewall 131. In other embodiments, a securement device is used to hold the quartz against the crucible sidewall (e.g., a barrier that limits radial movement of the quartz). Quartz is maintained at the surface 111 of the melt 104 due to the buoyancy of quartz relative to silicon.

Quartz 144 added to the melt 104 may include hydroxide (OH) incorporated therein. When synthetic quartz is used, the hydroxide amount may be controlled during production of the quartz. For example, the atmosphere in which synthetic quartz is produced (e.g., during extrusion of the quartz rod) may be controlled to change the amount of hydroxide incorporated into the synthetic quartz rod. Higher dissolution also reduces crystallization on the quartz 144 surface as such crystals can flake off from the quartz material which may cause the ingot 113 to lose zero dislocation. Less hydroxide allows quartz to remain in the melt for a longer portion of the ingot cycle time.

While the methods of the present disclosure have been described as being part of a batch Czochralski process (i.e., polycrystalline silicon is not added to the melt during ingot growth), in other embodiments, quartz may be added in a continuous Czochralski process in which polycrystalline silicon is added to the melt during ingot growth.

Compared to conventional methods for forming a single crystal silicon ingot, methods of the present disclosure have several advantages. By adding quartz to the melt and positioning quartz at or near the crucible-melt surface interface, the quartz dissolves which adds oxygen to the melt. This oxygen evaporates from the melt (as SiO) thereby reducing the amount of oxygen dissolved from the crucible at the crucible-melt surface interface (i.e., reducing erosion at the interface). This is particularly advantageous for high or ultra-high resistivity applications which involve longer cycle times which cause the crucible-melt surface interface to be at the same position of the crucible for longer periods. High or ultra-high resistivity applications are also highly-sensitive to impurities input into the melt from the crucible (e.g., aluminum, boron and phosphorous which affect the resistivity of the resulting ingot). The methods of the present disclosure are also advantageous in embodiments in which the crucible includes a synthetic quartz liner that is backed by a sand quartz base layer. Such base layers may include 50 to 100 times the impurity amount of the synthetic quartz liner. By adding quartz to the melt, erosion and cut-through of the synthetic quartz liner can be reduced or prevented. Quartz positioned near the crucible sidewall may also dampen melt vibrations.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for forming a single crystal silicon ingot comprising:
    adding solid-phase polycrystalline silicon to a crucible having a sidewall and a bottom;
    heating the polycrystalline silicon to form a silicon melt having a surface;
    contacting the silicon melt with a seed crystal;
    withdrawing the seed crystal from the silicon melt to form a silicon ingot;
    adding solid-phase synthetic quartz to the melt, the synthetic quartz being made by melting synthetic sand and extruding the melt of synthetic sand; and
    at least partially dissolving the synthetic quartz, the synthetic quartz abutting the crucible sidewall at the surface of the melt when being dissolved, the surface of the melt being unobstructed between the ingot and the synthetic quartz, there being a gap between the synthetic quartz and ingot after addition of all synthetic quartz to the melt.

2. The method as set forth in claim 1 wherein the synthetic quartz contains 5.0 ppmw or less impurities.

3. The method as set forth in claim 1 wherein the crucible comprises a quartz base layer and a synthetic quartz liner disposed on the quartz base layer.

4. The method as set forth in claim 1 wherein the synthetic quartz is disposed about the entire circumference of the crucible at the surface of the melt.

5. The method as set forth in claim 1 comprising rotating the crucible, wherein centrifugal force caused by rotation of the crucible causes the synthetic quartz to abut the crucible sidewall.

6. The method as set forth in claim 1 wherein the synthetic quartz is added before growth of the silicon ingot.

7. The method as set forth in claim 1 wherein synthetic quartz is added during ingot growth.

8. The method as set forth in claim 1 wherein synthetic quartz is added no more than once to the melt.

9. The method as set forth in claim 1 wherein synthetic quartz is added to the melt in two or more cycles.

10. The method as set forth in claim 1 wherein the ingot is grown in a batch Czochralski process and polycrystalline silicon is not added to the melt during ingot growth.

11. The method as set forth in claim 1 wherein the ingot is grown in a continuous Czochralski process in which polycrystalline silicon is added to the melt during ingot growth.

12. A method for forming a single crystal silicon ingot comprising:
   adding solid-phase polycrystalline silicon to a crucible having a sidewall and a bottom;
   heating the polycrystalline silicon to form a silicon melt;
   contacting the silicon melt with a seed crystal;
   withdrawing the seed crystal from the silicon melt to form a silicon ingot, the ingot being grown in a batch Czochralski process with polycrystalline silicon not being added to the melt during ingot growth;
   adding solid-phase quartz to the melt such that solid-phase quartz only extends partially across a surface of the silicon melt; and
   at least partially dissolving the quartz to reduce dissolution of the crucible, the quartz abutting the entire circumference of the crucible at the surface of the melt when being dissolved, the surface of the melt being unobstructed between the ingot and the solid-phase quartz.

13. The method as set forth in claim 12 wherein the quartz is shaped as a rod, tube, sphere or has an irregular shape.

14. The method as set forth in claim 12 wherein the quartz contains 0.7 ppmw or less impurities.

15. The method as set forth in claim 12 wherein the crucible comprises a quartz base layer and a synthetic quartz liner disposed on the quartz base layer.

16. The method as set forth in claim 12 comprising rotating the crucible, wherein centrifugal force caused by rotation of the crucible causes the solid-phase quartz to abut the crucible sidewall.

17. The method as set forth in claim 12 wherein the solid-phase quartz are added before growth of the silicon ingot or during ingot growth.

\* \* \* \* \*